United States Patent
Curcio et al.

(10) Patent No.: US 11,544,039 B2
(45) Date of Patent: Jan. 3, 2023

(54) RANDOM NUMBER GENERATOR

(71) Applicant: Cisco Technology, Inc., San Jose, CA (US)

(72) Inventors: Michael G. Curcio, Cary, NC (US); Kent H. Hoult, Lunenburg, MA (US); Kevin T. Mortimer, Bolton, MA (US)

(73) Assignee: Cisco Technology, Inc., San Jose, CA (US)

( * ) Notice: Subject to any disclaimer, the term of this patent is extended or adjusted under 35 U.S.C. 154(b) by 117 days.

(21) Appl. No.: 17/074,562

(22) Filed: Oct. 19, 2020

(65) Prior Publication Data

US 2022/0121422 A1 Apr. 21, 2022

(51) Int. Cl.
*G06F 7/58* (2006.01)
*H03K 3/84* (2006.01)
*H03K 3/03* (2006.01)

(52) U.S. Cl.
CPC .............. *G06F 7/582* (2013.01); *G06F 7/588* (2013.01); *H03K 3/0315* (2013.01); *H03K 3/84* (2013.01)

(58) Field of Classification Search
CPC ....... G06F 7/588; G06F 7/582; H03K 3/0315; H03K 3/84
USPC ....... 708/250, 255, 256, 254, 253, 252, 251; 331/57
See application file for complete search history.

(56) References Cited

U.S. PATENT DOCUMENTS

2013/0019324 A1 1/2013 Tehranipoor et al.

FOREIGN PATENT DOCUMENTS

| CN | 105867877 A | 8/2016 |
|---|---|---|
| CN | 109271136 A | 1/2019 |
| WO | 2014007583 A1 | 1/2014 |

OTHER PUBLICATIONS

Matuszewski et al., Producing Random Bits with Delay Line Based Ring oscillators, Intl, Jl. of Electronics and Telecom. Mar. 2013 (Year: 2013).*
Liu et al, A nonlinearity Minimization-Oriented Resource-Saving Time-to Digital Convertert Implemented in a 28 nm Xilinx FPGA (Year: 2015).*
Rethinam S., Rajagopalan S., Arumugham S., Janakiraman S., Lakshmi C., Rengarajan A. (2020) Pyramid Entropy Source for True Random Number Generator on FPGA. In: Pati B., Panigrahi C., Buyya R., Li KC. (eds) Advanced Computing and Intelligent Engineering. Advances in Intelligent Systems and Computing, vol. 1089.

(Continued)

*Primary Examiner* — Arnold M Kinkead
(74) *Attorney, Agent, or Firm* — Patterson + Sheridan, LLP

(57) ABSTRACT

An apparatus includes a ring oscillator, a carry chain circuit, and a detector circuit. The ring oscillator produces a clock signal. The carry chain circuit includes a plurality of stages. Each stage of the plurality of stages includes a plurality of lookup table elements coupled in sequence. The carry chain circuit propagates the clock signal through the plurality of lookup table elements of the plurality of stages. The detector circuit determines, based on a value of the clock signal stored by a final lookup table element of each stage of the plurality of stages, which stage of the plurality stages contains an edge of the clock signal. The detector circuit then outputs a zero if the determined stage is assigned to a first group of the plurality of stages and a one if the determined stage is assigned to a second group of the plurality of stages.

20 Claims, 9 Drawing Sheets

(56) References Cited

OTHER PUBLICATIONS

V. Rozic, B. Yang, W. Dehaene and I. Verbauwhede, "Highly efficient entropy extraction for true random number generators on FPGAs," 2015 52nd ACM/EDAC/IEEE Design Automation Conference (DAC), San Francisco, CA, 2015, pp. 1-6.
B. Yang, V. Rožic, M. Grujic, N. Mentens and I. Verbauwhede, "On-chip jitter measurement for true random number generators," 2017 Asian Hardware Oriented Security and Trust Symposium (AsianHOST), Beijing, 2017, pp. 91-96.
M. Grujic, V. Rožic, B. Yang and I. Verbauwhede, "A Closer Look at the Delay-Chain based TRNG," 2018 IEEE International Symposium on Circuits and Systems (ISCAS), Florence, 2018, pp. 1-5.
M. Grujic, B. Yang, V. Rožic and I. Verbauwhede, "Towards inter-vendor compatibility of true random number generators for FPGAs," 2018 Design, Automation & Test in Europe Conference & Exhibition (DATE), Dresden, 2018, pp. 1520-1523.
J. Balasch et al., "Design and testing methodologies for true random number generators towards industry certification," 2018 IEEE 23rd European Test Symposium (ETS), Bremen, 2018, pp. 1-10.
Ali Murat Garipcan et al., "Implementation of a Digital TRNG Using Jitter Based Multiple Entropy Source on FPGA," Journal of Microelectronics, Electronic Components and Materials, vol. 49, No. 2, (Year: 2019), pp. 79-90.

\* cited by examiner

RANDOM NUMBER GENERATOR

TECHNICAL FIELD

Embodiments presented in this disclosure generally relate to random number generation. Specifically, embodiments disclosed herein relate to a random number generator that provides improved randomness in certain embodiments.

BACKGROUND

Random number generators are useful in several applications, such as, cryptography and encryption. These random number generators are evaluated based on the level of randomness in the numbers they generate. A random number generator with good performance generates a more unpredictable sequence of numbers than a random number generator with poorer performance. Stated differently, the poorer a random number generator performs; the easier it is to predict the next number generated by the random number generator. The level of unpredictability of a random number generator may be described as the entropy in the random number generator.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted; however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
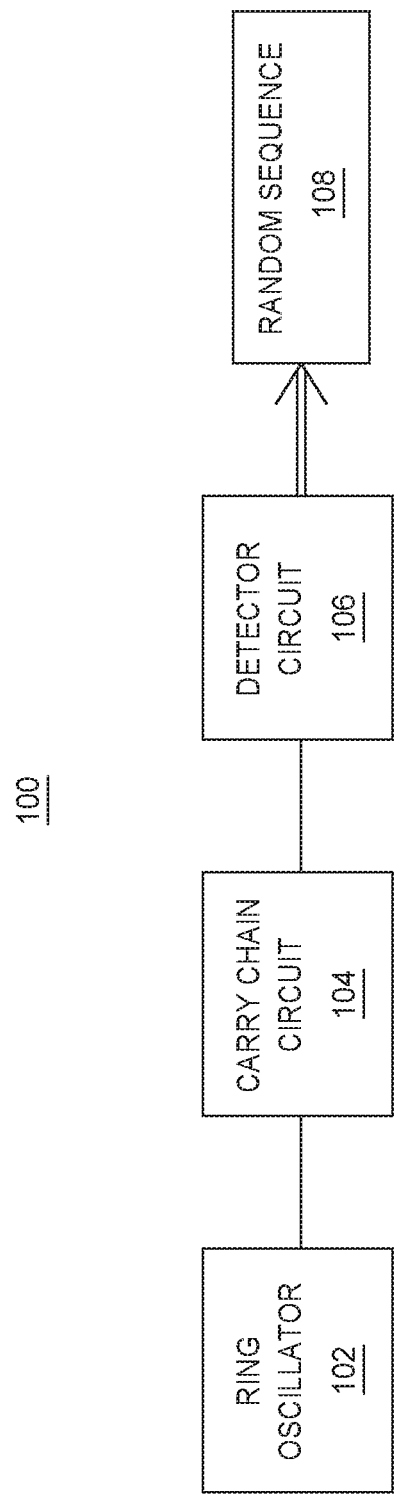
FIG. 1 illustrates an example random number generator.

One embodiment presented in this disclosure is an apparatus that includes a ring oscillator, a carry chain circuit, and a detector circuit. The ring oscillator produces a clock signal. The carry chain circuit includes a plurality of stages. Each stage of the plurality of stages includes a plurality of lookup table elements coupled in sequence. The carry chain circuit propagates the clock signal through the plurality of lookup table elements of the plurality of stages. The detector circuit determines, based on a value of the clock signal stored by a final lookup table element of each stage of the plurality of stages, which stage of the plurality of stages contains an edge of the clock signal. The detector circuit then outputs a zero if the determined stage is assigned to a first group of the plurality of stages and a one if the determined stage is assigned to a second group of the plurality of stages.

In an embodiment, the apparatus further includes a second ring oscillator and a second carry chain circuit. The second ring oscillator produces a second clock signal. The second carry chain circuit includes a second plurality of stages. Each stage of the second plurality of stages includes a plurality of lookup table elements coupled in sequence. The second carry chain circuit propagates the second clock signal through the plurality of lookup table elements of the second plurality of stages. In an embodiment, the apparatus further includes a first counter, a second counter, and a controller. The first counter counts a first number of edges of the clock signal over a period of time. The second counter counts a second number of edges of the second clock signal over the period of time. The controller determines, based on the first number of edges, a frequency of the clock signal and a delay width for the carry chain circuit, determines, based on the second number of edges, a frequency of the second clock signal and a delay width for the second carry chain circuit, and determines, based on the frequency of the clock signal, the delay width for the carry chain circuit, the frequency of the second clock signal, and the delay width for the second carry chain circuit, an amount of jitter in the clock signal. Counting the second number of edges of the second clock signal may be based on a value of the second clock signal stored by each lookup table element of the plurality of lookup table elements of a first stage of the second plurality of stages.

The plurality of stages may include eight stages and each stage of the plurality of stages may include twelve lookup table elements. The carry chain circuit may capture two periods of the clock signal simultaneously, A stage of the plurality of stages assigned to the first group may be directly coupled to a stage of the plurality of stages assigned to the second group.

Another embodiment presented in this disclosure is a method that includes producing, by a ring oscillator, a clock signal and propagating the clock signal through a plurality of stages of a carry chain circuit. Each stage of the plurality of stages includes a plurality of lookup table elements coupled in sequence. The method also includes determining, by a detector circuit and based on a value of the clock signal stored by a final lookup table element of each stage of the plurality of stages, which stage of the plurality of stages contains an edge of the clock signal. The method further includes outputting a zero if the determined stage is assigned to a first group of the plurality of stages and a one if the determined stage is assigned to a second group of the plurality of stages.

Another embodiment presented in this disclosure is a field programmable gate array that implements a ring oscillator, a carry chain circuit, and a detector circuit. The ring oscillator produces a clock signal. The carry chain circuit includes a plurality of stages. Each stage of the plurality of stages includes a plurality of lookup table elements coupled in sequence. The carry chain circuit propagates the clock signal through the plurality of lookup table elements of the plurality of stages. The detector circuit determines, based on a value of the clock signal stored by a final lookup table element of each stage of the plurality of stages, which stage of the plurality of stages contains an edge of the clock signal. The detector circuit also outputs a zero if the determined stage is assigned to a first group of the plurality of stages and a one if the determined stage is assigned to a second group of the plurality of stages.

Example Embodiments

This disclosure contemplates a random number generator that provides improved randomness relative to conventional random number generators, in certain embodiments. Generally, the random number generator generates a clock signal using a ring oscillator. The clock signal is propagated through multiple stages of a carry chain circuit, where each stage includes a chain of lookup table elements. A detector circuit analyzes the output of the final lookup table element in each stage to determine in which stage a clock edge of the clock signal appears. Then, the detector circuit outputs a 0 or a 1 depending on the stage that contains the clock edge.

Because environmental factors may cause jitter in the clock signal and affect the delay in the carry chain circuit, the stage in which the clock edge appears may change unpredictably with each period of the clock. As a result, the sequence of 0s and 1s outputted by the detector circuit may also change unpredictably and thus, is considered a random number. In particular embodiments, the random number generator more accurately determines the stage of the carry chain circuit in which a clock edge appears because the random number generator determines the stage based on the value captured by a final lookup table element in each stage. As a result, the random number generator generated by the detector circuit has a higher level of randomness compared to more conventional random number generators.

FIG. 1 illustrates an example random number generator 100. As seen in FIG. 1, the random number generator 100 includes a ring oscillator 102, a carry chain circuit 104, and a detector circuit 106. Generally, the components of the random number generator 100, operate together to generate a random sequence 108. In particular embodiments, the random sequence 108 has a higher level of randomness relative to random sequences generated by conventional random number generators.

The ring oscillator 102 generates a clock signal that is used by other components of the random number generator 100 to generate the random sequence 108. Generally, the ring oscillator 102 uses a feedback loop to generate an alternating clock signal. In some embodiments, the frequency of the clock signal is around 900 megahertz. Environmental factors such as temperature and voltage affect the components of the ring oscillator 102 such that jitter is introduced into the clock signal generated by the ring oscillator 102. The jitter may change the period of the clock signal unpredictably. Stated differently, each period of the clock signal may have a different width than other periods of the clock signal. Because these changes in width are unpredictable, the widths can be evaluated to produce the random sequence 108.

The carry chain circuit 104 propagates the clock signal from the ring oscillator 102. Generally, the carry chain circuit 104 includes multiple stages of lookup table elements, coupled in sequence. Each stage may include its own chain of lookup table elements. As the clock signal propagates through the carry chain circuit 104, registers in each stage of the carry chain circuit 104 store the value of the clock signal in that stage. These register values are then passed to the detector circuit 106 for analysis.

The detector circuit 106 analyzes the register values from the carry chain circuit 104 to generate the random sequence 108. Generally, the detector circuit 106 samples the register values at a particular frequency. For example, the detector circuit 106 may sample the register values at the frequency of the clock signal. As another example, the detector circuit 106 may sample the register values at the frequency of a clock signal different from the clock signal generated by the ring oscillator 102 (e.g., a core clock signal). The detector circuit 106 analyzes the register values to determine in which stage of the carry chain circuit 104 an edge of the clock signal appears. For example, the detector circuit 106 may examine the register values to determine in which register the clock signal transitions from a zero to a one or a one to a zero. As another example, the detector circuit 106 may determine the first register in the sequence of registers where the value of the register and the value of the subsequent register are both one.

After determining the stage in which the clock edge appears, the detector circuit 106 generates a bit of the random sequence 108 based on the determined stage. Certain stages of the carry chain circuit 104 may be assigned to a first group, and the other stages of the carry chain circuit 104 may be assigned to a second group. In certain embodiments, the stages of the carry chain circuit 104 are alternately assigned to the two groups, such that every other stage of the carry chain circuit 104 is assigned to the same group. As a result, an alternating pattern of stages occurs in the carry chain circuit 104. This disclosure contemplates the stages of the carry chain circuit 104 being assigned to any suitable group in any suitable manner. The detector circuit 106 outputs a zero or a one if the determined stage is assigned to the first group, and the opposite value if the determined stage is assigned to the second group. Because the jitter in the clock signal changes the width of the clock signal unpredictably from period to period, the stage in which the clock edge appears may also change unpredictably from period to period. As a result, the sequence of zeros and ones generated by the detector circuit 106 may change unpredictably. This unpredictable sequence of zeros and ones forms the random sequence 108. In particular embodiments, the random sequence 108 has a higher level of randomness relative to random sequences generated by conventional random number generators.

Figure 2:
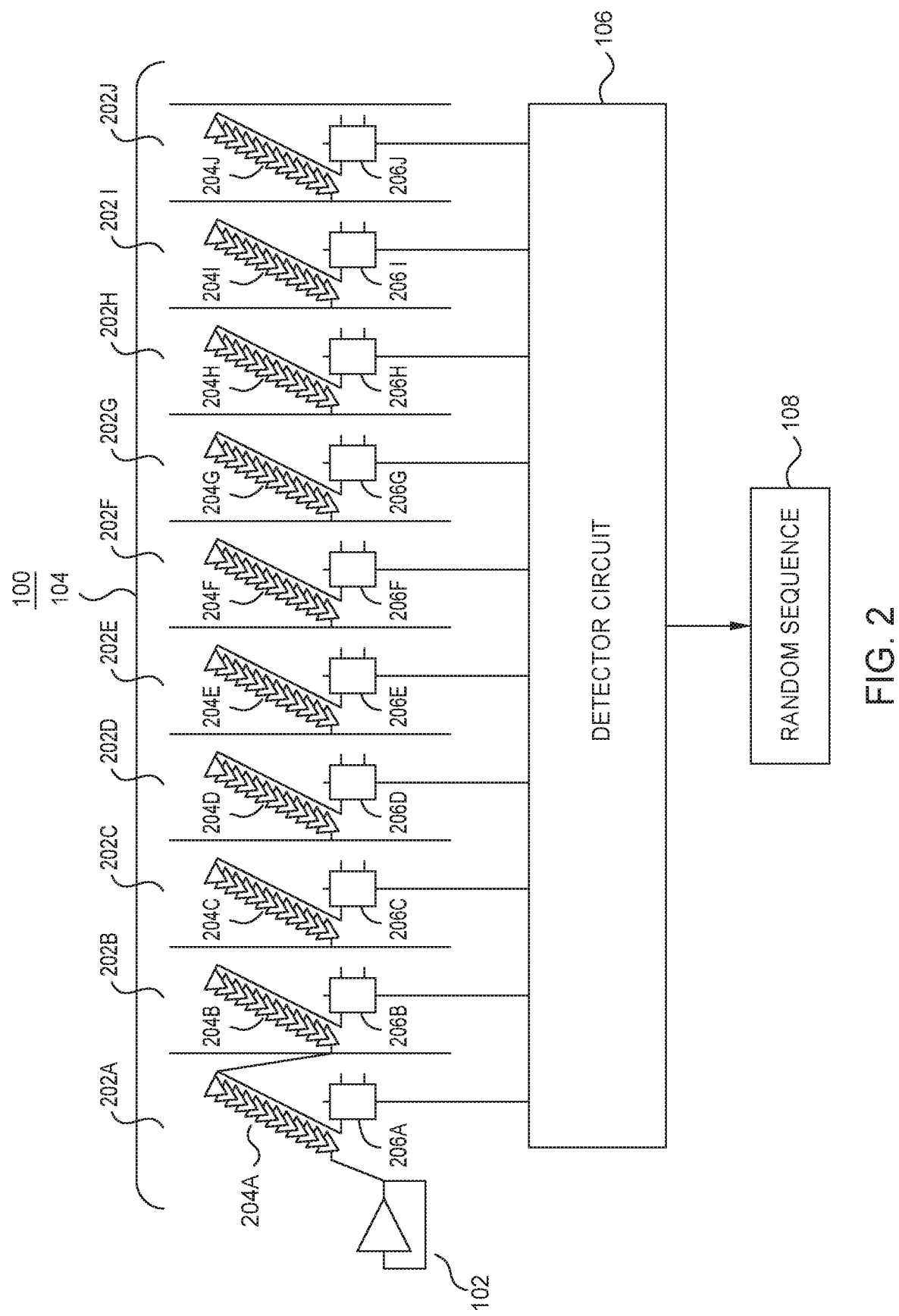
FIG. 2 illustrates components of the example random number generator of FIG. 1.

FIG. 2 illustrates components of the example random number generator 100 of FIG. 1. As seen in FIG. 2, the random number generator 100 includes the ring oscillator 102, the carry chain circuit 104, and the detector circuit 106. Generally, these components of the random number generator 100 operate together to generate a random sequence 108. In particular embodiments, the random sequence 108 includes a higher level of randomness relative to random sequences generated by conventional random number generators.

As discussed with respect to FIG. 1, the ring oscillator 102 uses a feedback loop to generate a clock signal for the other components of the random number generator 100. Environmental factors may cause jitter in the clock signal. As a result, the period of the clock signal changes unpredictably over time. The other components of the random number generator 100 take advantage of this unpredictable behavior to generate the random sequence 108.

The carry chain circuit 104 propagates the clock signal through multiple stages 202. The carry chain circuit 104 may include any suitable number of stages 202. In the example of FIG. 2, the carry chain circuit 104 includes stages 202A, 202B, 202C, 202D, 202E, 202F, 202G, 202H, 202I, and 202J. The stages 202 are arranged in sequence such that the clock signal propagates through each stage 202 sequentially. In the example of FIG. 2, the clock signal propagates from ring oscillator 102 through stage 202A. The clock signal then propagates through the stage 202B followed by the stage 202C, and so on, until the clock signal propagates through the stage 202J.

Each stage 202 of the carry chain circuit 104 includes a chain of lookup table elements 204 and a register 206. In the example of FIG. 2, stage 202A includes lookup table elements 204A and a register 206A. Stage 202B includes lookup table elements 204B and a register 206B. Stage 202C includes lookup table elements 204C and a register 206C. Stage 202D includes lookup table elements 204D and a register 206D. Stage 202E includes lookup table elements 204E and a register 206E. Stage 202F includes lookup table elements 204F and a register 206F. Stage 202G includes lookup table elements 204G and a register 206G. Stage 202H includes lookup table elements 204H and a register 206H. Stage 202I includes lookup table elements 204I and a register 206I. Stage 202J includes lookup table elements 204J and a register 206J. Each chain of lookup table elements 204 may include any suitable number of lookup table elements 204. In the example of FIG. 2, each chain includes twelve lookup table elements 204. In some embodiments, the ring oscillator 102 serves as the first lookup table element 204 in the first chain. Generally, the clock signal propagates through each chain of lookup table elements 204 in sequence. In the example of FIG. 2, the clock signal propagates through the chain of lookup table elements 204A and then the chain of lookup table elements 204B, and so on, until the clock signal propagates through the chain of lookup table elements 204J.

The registers 206 store a value of the clock signal in the last lookup table element 204 in each stage 202. Thus, as the clock signal propagates through the stages 202, the values in the registers 206 change. For example, if a high clock signal is propagating through the last lookup table element in a stage 202, then the register 206 for that stage 202 will store a one. On the other hand, if a low clock signal is propagating through the last lookup table element of the stage 202, then the register 206 for that stage 202 will store a zero.

In certain embodiments, environmental factors affect the speed at which the clock signal propagates through the chains of lookup table elements 204. For example, environmental factors may increase or decrease the delay of certain lookup table elements 204. As a result, the speed at which the clock signal propagates through the stages 202 changes unpredictably over time. This unpredictability may further improve the level of randomness in the random sequence 108.

The detector circuit 106 receives the values stored in the registers 206 of the carry chain circuit 104. The detector circuit 106 analyzes these stored values to generate the random sequence 108. In certain embodiments, the detector circuit 106 samples the values stored in the registers 206 at a particular frequency such as, for example, the frequency of the clock signal or the frequency of a separate clock signal (e.g.; a core clock).

The detector circuit 106 analyzes the values in the registers 206 to determine in which stage 202 of the carry chain circuit 104 an edge of the clock signal appears. For example, the detector circuit 106 may examine the values in the sequence of registers 206 to determine in which stage 202 the clock signal transitions from zero to a one or one to a zero. As another example, the detector circuit 106 may analyze the values from the sequence of registers 206 to determine the first register 206 in the sequence that stores a one and has a subsequent register 206 that also stores a one. Based on this analysis, the detector circuit 106 determines a stage 202 in which a clock edge of the clock signal appears.

The detector circuit 106 then outputs a zero or a one depending on whether that stage 202 is assigned to a first group or a second group. For example, the detector circuit 106 may output a zero or a one if that stage 202 is assigned to a first group and the opposite value if that stage 202 is assigned to the second group. The stages 202 may be assigned to any suitable group in any suitable manner. For example, the stages 202 may be alternately stored in the first group or the second group. Using the example of FIG. 2, stages 202A, 202C, 202E, 202G, and 202I, may be assigned to a first group, while stages 202B, 202D, 202F, 202H, and 202J are stored to a second group. If the detector circuit 106 determines that a clock edge appears in the stage 202C, then the detector circuit 106 may output a zero. If the detector circuit 106 determines that the clock edge appears in stage 202D, then the detector circuit 106 may output a one. Due to the environmental factors affecting the clock signal and the carry chain circuit 104 in unpredictable ways, the edge of the clock signal may not appear in the same stage 202 from period to period. As a result, it may be unpredictable whether the detector circuit 106 outputs a zero or a one.

The sequence of zeros and ones outputted by the detector circuit 106 form the random sequence 108. In particular embodiments, the random number generator 100 produces a random sequence 108 that includes a higher level of randomness relative to sequences generated by conventional random number generators.

Figure 3:
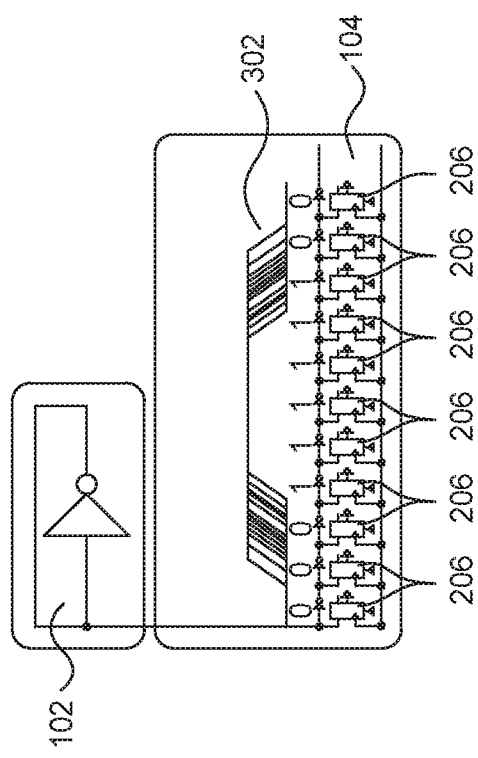
FIG. 3 illustrates components of the example random number generator of FIG. 1.

FIG. 3 illustrates components of the example random number generator 100 of FIG. 1. Specifically, FIG. 3 illustrates the ring oscillator 102 sending a clock signal 302 through the carry chain circuit 104. As the clock signal 302 propagates through the carry chain circuit 104, the values stored by the registers 206 match the value of the clock signal at those registers 206. For example, as seen in FIG. 3, when a high clock signal is being propagated through a register 206, that register 206 stores a value of one. When a low clock signal is propagating through a register 206, that register 206 stores a value of zero.

Figure 4:
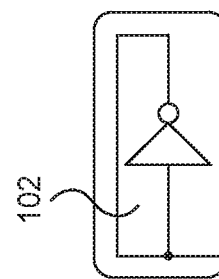
FIG. 4 illustrates components of the example random number generator of FIG. 1.

FIG. 4 illustrates components of the example random number generator 100 of FIG. 1. Specifically, FIG. 4 illustrates a clock signal 302 being propagated through chains of lookup table elements 204 in the carry chain circuit 104. As seen in FIG. 4, the registers 206 store the value of the clock signal propagating through the lookup table elements 204. Significantly, the lookup table elements 204 near an edge of the clock signal 302 may be unstable and transition between zeros and ones. Thus, it may be difficult to determine the location of the edge of the clock signal by looking at the values of the individual lookup table elements 204. The random number generator 100 instead evaluates the value of the last lookup table element 204 in each stage 202 of the carry chain circuit 104. In this manner, it is not necessary to determine the lookup table element 204 in which an edge of the clock signal 302 appears, which is a difficult determination to make. Rather, the random number generator 100 makes the easier determination of which stage 202 contains the edge of the clock signal 302. In particular embodiments, the random number generator 100 can more accurately determine the stage 202 in which the edge of the clock signal 302 appears rather than the lookup table element 204 in which the edge of the clock signal 302 appears. As a result, the level of randomness in the random sequence 108 produced by the random number generator 100 is increased.

As discussed previously, the carry chain circuit 104 may include any suitable number of stages 202 and lookup table elements 204. In certain embodiments, the carry chain circuit 104 may include a sufficient number of stages and/or lookup table elements 204 to capture two or more consecutive periods of the clock signal 302 simultaneously. Stated differently, the carry chain circuit 104 may propagate two or more periods of the clock signal at the same time. In these embodiments, the detector circuit 106 may analyze two or more periods of the clock signal at the same time (e.g., detect the stages of multiple clock edges).

Figure 5:
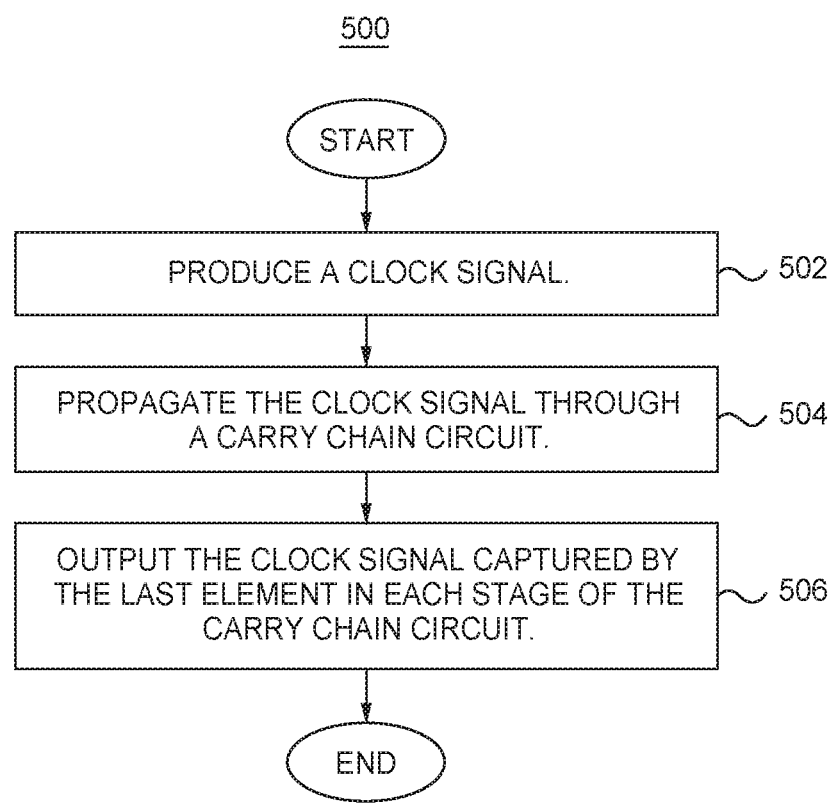
FIG. 5 is a flowchart illustrating a process for generating and capturing a clock signal using the example random number generator of FIG. 1.

FIG. 5 is a flowchart illustrating a process 500 for generating and capturing a clock signal 302 using the example random number generator 100 of FIG. 1. Generally, one or more components of the random number generator 100 perform the steps of process 500. In particular embodiments, by performing process 500, the level of randomness of an output random sequence 108 is improved.

The ring oscillator 102 produces a clock signal 302 in step 502. As discussed previously, the ring oscillator 102 uses a feedback loop to generate an alternating clock signal 302. Environmental factors may introduce jitter into this clock signal 302 such that the period of the clock signal 302 changes unpredictably over time. Because the clock signal 302 changes unpredictably over time, the clock signal 302 may be used to produce a random sequence 108.

In step 504, the carry chain circuit 104 propagates the clock signal 302. The carry chain circuit 104 includes multiple stages 202 of lookup table elements 204. Each stage 202 includes a chain of lookup table elements 204. The carry chain circuit 104 may include any suitable number of stages 202, which may include any suitable number of lookup table elements 204. In an embodiment, the carry chain circuit 104 includes eight stages 202, and each stage 202 includes twelve lookup table elements 204. A register 206 in each stage 202 stores the value in the last lookup table element 204 of that stage 202. As the clock signal 302 propagates through the carry chain circuit 104, the value stored by the registers 206 change to reflect the propagation of the clock signal 302.

Environmental factors affect the speed at which the clock signal 302 propagates through the stages 202. For example, temperature and voltage affect the delay introduced by each lookup table element 204 in each stage 202. As a result, the speed at which the clock signal 302 propagates through the stages 202 changes unpredictably. This unpredictability introduces more randomness into the random sequence 108. In step 506, the registers 206 output the clock signal 302. These values are then analyzed to generate the random sequence 108.

Figure 6:
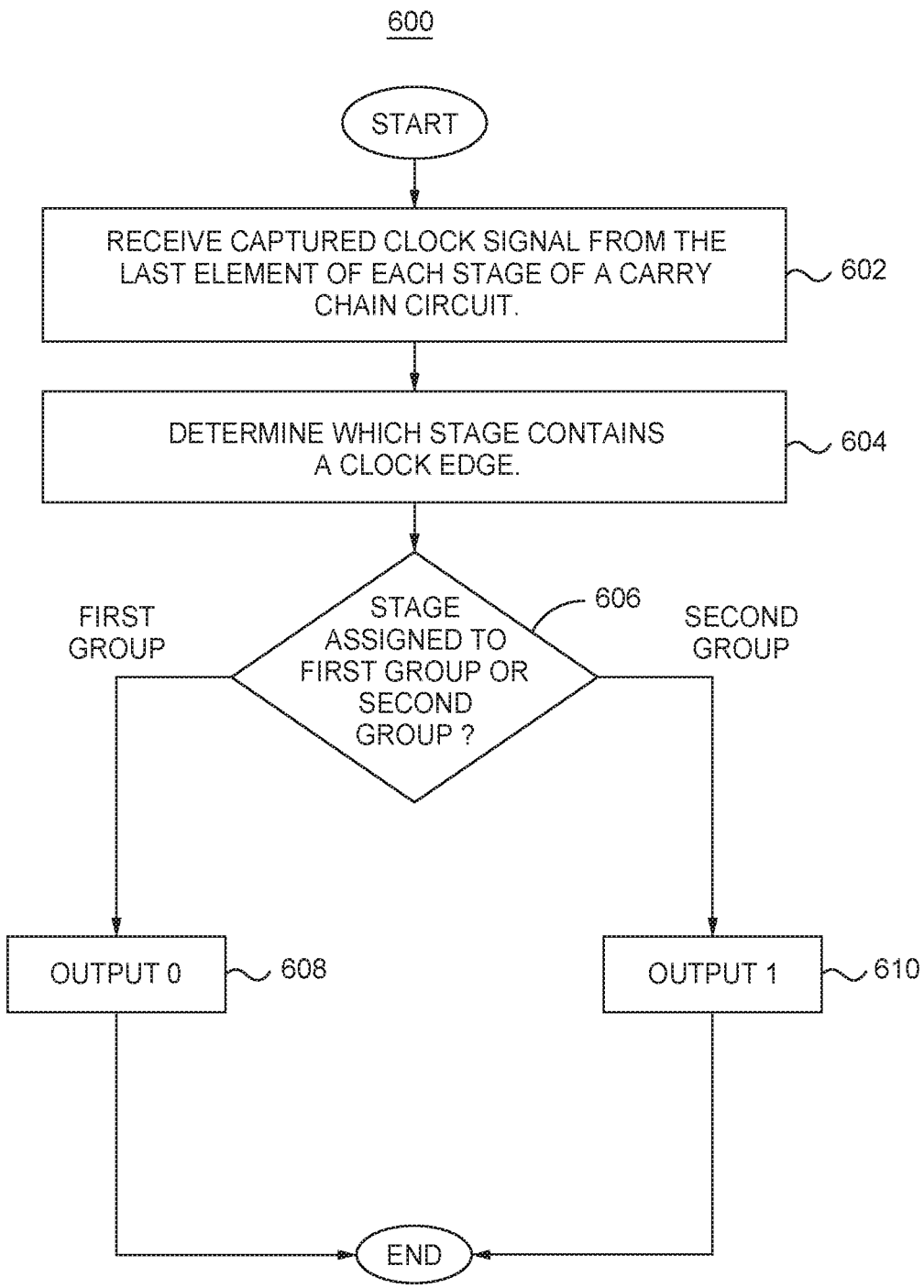
FIG. 6 is a flowchart illustrating a process for generating a random number using the example random number generator of FIG. 1.

FIG. 6 is a flowchart illustrating a process 600 for generating a random number using the example random number generator 100 of FIG. 1. Generally, the detector circuit 106 performs the steps of process 600. In particular embodiments, by performing process 600, the level of randomness in a generated random sequence 108 is increased.

The detector circuit 106 begins by receiving a captured clock signal 302 from the last lookup table element 204 of each stage 202 of a carry chain circuit 104 in step 602. As discussed previously, each stage 202 includes a register 206 that stores the value of the last lookup table element 204 in that stage 202. The value in the register 206 is sent to the detector circuit 106. The detector circuit 106 may sample the values in the registers 206 at a particular frequency such as for example, the frequency of the clock signal 302 or a separate clock signal (e.g., a core clock). In some embodiments, the detector circuit 106 samples the registers 206 at a much lower frequency than the frequency of the clock signal 302 to allow jitter to accumulate between each sample.

In step 604, the detector circuit 106 determines which stage 202 contains a clock edge of the clock signal 302. The detector circuit 106 analyzes the sampled values from the registers 206 to determine which stage 202 contains the clock edge. For example, the detector circuit 106 may determine where in the sequence of registers 206 the clock signal 302 transitions from a zero to a one or a one to a zero. As another example, the detector circuit 106 may determine the first register 206 in the sequence of registers 206 that stores a one and has a subsequent register 206 that also stores a one. Based on one or more of these determinations, the detector circuit 106 may identify a stage 202 or a register 206 that contains the clock edge.

In step 606, the detector circuit 106 determines whether the identified stage 202 or the identified register 206 is assigned to a first group or a second group. The stages 202 and/or registers 206 may be assigned to any suitable group in any suitable manner. In some embodiments, the stages 202 and registers 206 are alternately stored in the first group and the second group. Stated differently, the stages 202 and/or registers 206 alternate between being assigned to the first group or the second group.

If the identified stage 202 or register 206 is assigned to the first group, the detector circuit 106 outputs a zero in step 608. If the identified stage 202 or register 206 is assigned to the second group, the detector circuit 106 outputs a one in step 610. As discussed previously, because environmental factors change the clock signal 302 unpredictably and the speed at which the clock signal 302 propagates through the carry chain circuit 104 unpredictably, the stage 202 in which the clock edge appears from period to period also changes unpredictably. The natural phenomena that determine the physical behavior of solid state electronic circuits at an atomic level also play a role in creating unpredictable elements of instability that increase the overall amount of jitter or randomness in the clock signal 302. As a result, the value outputted by the detector circuit 106 also changes unpredictably. The output values form the random sequence 108.

Figure 7:
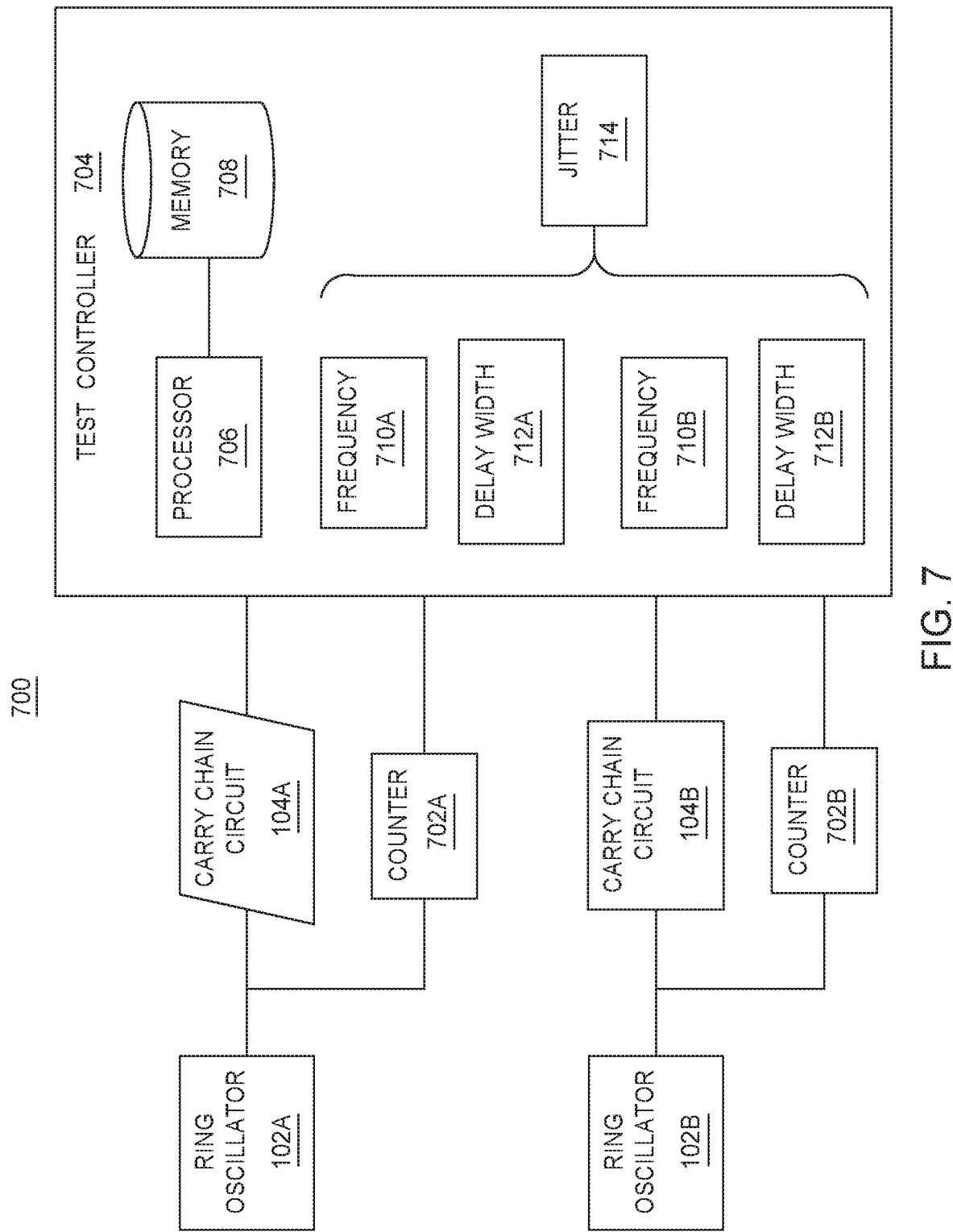
FIG. 7 illustrates a test circuit for the example random number generator of FIG. 1.

FIG. 7 illustrates a test circuit 700 for the example random number generator 100 of FIG. 1. Generally the test circuit 700 pairs two random number generator circuits to determine an amount of jitter in a clock signal 302. As seen in FIG. 7, test circuit 700 includes ring oscillators 102A and 102B, carry chain circuits 104A and 104B, counters 702A and 702B, and a test controller 704. In some embodiments, counters 702A and 702B are positioned between the carry chain circuits 104A and 104B and the test controller 704. Stated differently, in these embodiments, the counters 702A and 702B are connected in series with the carry chain circuits 104A and 104B and the test controller 704. In particular embodiments, the test circuit 700 can determine an amount of jitter in a clock signal produced by ring oscillator 102A or 102B.

Similar to the design of the random number generator 100, the ring oscillators 102A and 102B use feedback loops to generate clock signals. Additionally, the carry chain circuits 104A and 104B propagate these clock signals. Environmental factors introduce jitter into these clock signals. The carry chain circuits 104A and 104B propagate the clock signals along with their jitter to test controller 704.

The counters 702A and 702B count a number of clock edges in the clock signals produced by the ring oscillators 102A and 102B, respectively. For a given period of time, the counters 702A and 702B detect and count the number of clock edges propagated by the ring oscillators 102A and 102B. The counters 702A and 702B communicate these counts to test controller 704. In some embodiments, the counters 702A and 702B may examine the values stored by every lookup table element 204 in a first stage 202 of a respective carry chain circuit 104A or 104B, rather than only the value stored by the last lookup table element 204 of that first stage 202, to determine whether the clock edge falls within the first stage 202.

Test controller 704 uses the information from the carry chain circuits 104A and 104B and the counters 702A and 702B to determine an amount of jitter in the clock signal produced by the ring oscillator 102A or 102B. As seen in FIG. 7, test controller 704 includes a processor 706 and a memory 708, which may be configured to perform any of the functions or actions of the test controller 704 described herein.

Processor 706 is any electronic circuitry, including, but not limited to microprocessors, application specific integrated circuits (ASIC), application specific instruction set processor (ASIP), and/or state machines, that communicatively couples to memory 708 and controls the operation of test controller 704. Processor 706 may be 8-bit, 16-bit, 32-bit, 64-bit or of any other suitable architecture. Processor 706 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. Processor 706 may include other hardware that operates software to control and process information. Processor 706 executes software stored on memory to perform any of the functions described herein. Processor 706 controls the operation and administration of test controller 704 by processing information received from carry chain circuits 104A and 104B, counters 702A and 702B, and memory 708. Processor 706 may be a programmable logic device, a microcontroller, a microprocessor, any suitable processing device, or any suitable combination of the preceding. Processor 706 is not limited to a single processing device and may encompass multiple processing devices.

Memory 708 may store, either permanently or temporarily, data, operational software, or other information for processor 706. Memory 708 may include any one or a combination of volatile or non-volatile local or remote devices suitable for storing information. For example, memory 708 may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in memory 708, a disk, a CD, or a flash drive. In particular embodiments, the software may include an application executable by processor 706 to perform one or more of the functions described herein.

The test controller 704 determines from the clock signal from the carry chain circuit 104A and/or the count from the counter 702A, a frequency 710A of the clock signal and a delay width 712A of the clock signal. For example, the test controller 704 may divide the number of counted clock edges by the period of time over which the count occurred to determine the frequency 710A of the clock signal. As another example, the test controller 704 may divide the period of time over which the count took place by the counted number of clock edges to determine the delay width 712A of the clock signal. For example, to compute the delay width 712A, the number of positive and negative clock edges captured in a given stage of the carry chain circuit 104A may be counted. These counts are proportional to the delay of each stage of the carry chain circuit 104A. The sums of these counts represent the total number of positive or negative edge transitions experienced by a set of the carry chain stages. The average of this total is taken for the first full period in each of the clock captures over the total number of experiments. The delay of each stage is estimated by multiplying the average clock period by the ratio of the individual stage edge counts to the average total count for a clock period.

The test controller 704 may repeat the same calculations to determine a frequency 710B and a delay width 712B of the clock signal produced by the ring oscillator 102B.

The test controller 704 may determine a jitter 714 present in the clock signal produced by the ring oscillator 102A or 102B by comparing the frequencies 710A and 710B and the delay widths 712A and 712B. For example, the test controller 704 may determine a difference between the frequencies 710A and 710B and a difference between the delay widths 712A and 712B to determine the differences between the two clock signals. The difference in the two clock signals represents the effects of jitter 714 present in both of the clock signals.

For example, the standard deviation of the jitter accumulated over a given time period may be calculated using the frequency 710 and the delay width 712. For a given clock sample, first determine the timing of the most recent falling edge by summing the delays of each stage of the carry chain circuit 104 that had propagated the last falling edge with the product of the average clock period times the recorded ripple count of rising edges for a given amount of jitter accumulation time. Average the differences of this timing for the two circuits (e.g., ring oscillators 102A/B and carry chain circuits 104A/B) across a large number of experiments and compute the standard deviation. The ratio of the variance in the differential delays to the accumulation time represents the jitter 714.

The determined jitter 714 represents the level of randomness in the clock signal generated by the ring oscillator 102B. In particular environments, knowing the level of randomness produced by the oscillator 102B is useful in verifying the amount of randomness in a random number generator embodying the ring oscillator 102B. The determined jitter 714 may alternatively represent the level of randomness in the clock signal generated by the ring oscillator 102A. Performing differential measurements between ring oscillator 102A/carry chain circuit 104A and ring oscillator 102B/carry chain circuit 104B is a mechanism to limit external effects on the measurement of the clock jitter. The presumption is that both instances will be affected more or less equally and simultaneously. With common components accounted for, this leaves local, independent, and random effects as the primary contributor to the jitter measurement.

Figure 8:
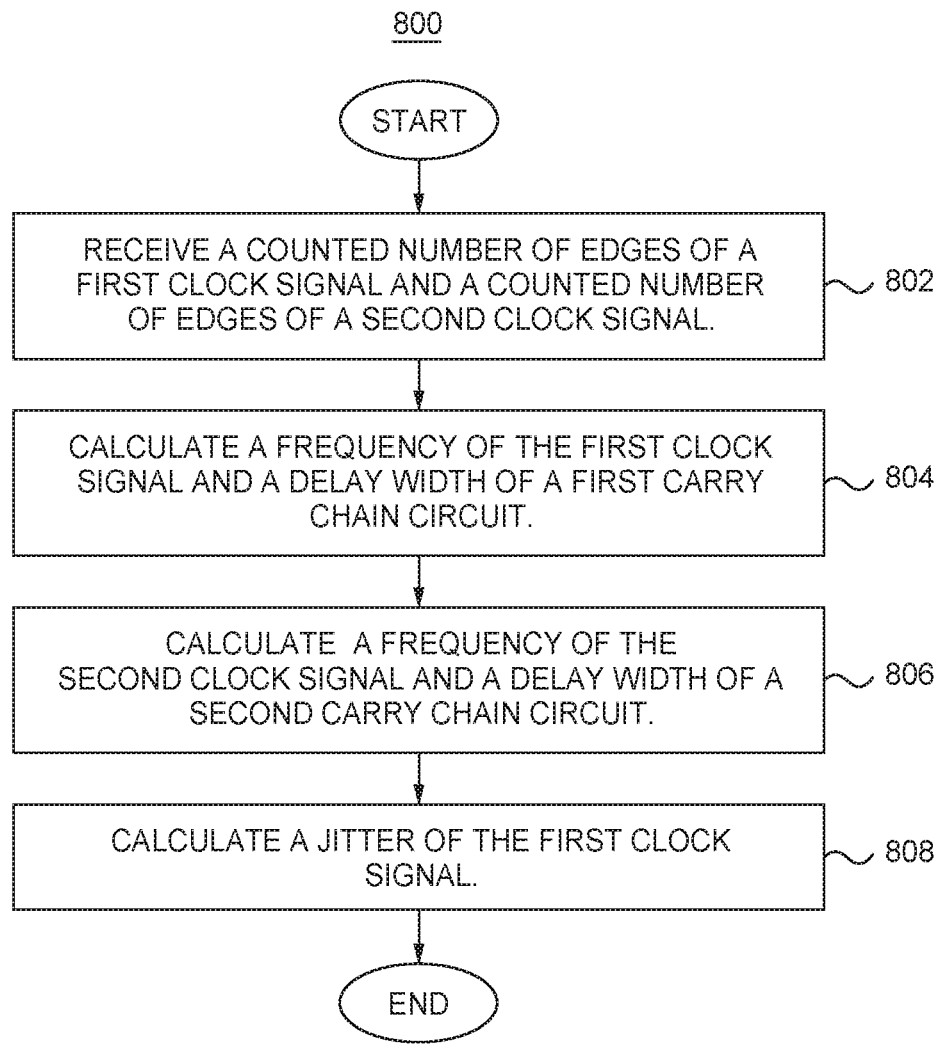
FIG. 8 is a flowchart illustrating a process for testing the example random number generator of FIG. 1.

FIG. 8 is a flowchart illustrating a process 800 for testing the example random number generator 100 of FIG. 1. Generally, test controller 704 performs the steps of process

800. In particular embodiments, by performing process 800, test controller 704 determines an amount of jitter 714 present in a clock signal.

Test controller 704 begins by receiving a counted number of clock edges of a first clock signal and a counted number of edges of a second clock signal in step 802. The two clock signals may have been generated by two different ring oscillators 102A and 102B. The clock edges may have been counted over a set period of time. Individual counters 702A and 702B may count the number of edges of the clock signals produced by the ring oscillators 102A and 102B. The counter 702A and 702B may report these counts to the test controller 704.

In step 804, the test controller 704 calculates a frequency 710A of the first clock signal produced by the ring oscillator 102A and a delay width 712A of a first carry chain circuit 104A. The test controller 704 may determine the frequency 710A by dividing the number of clock edges counted by counter 702A over a set period of time. To compute the delay width 712A, the number of positive and negative clock edges captured in a given stage of the carry chain circuit 104A may be counted. These counts are proportional to the delay of each stage of the carry chain circuit 104A. The sums of these counts represent the total number of positive or negative edge transitions experienced by a set of the carry chain stages. The average of this total is taken for the first full period in each of the clock captures over the total number of experiments. The delay of each stage is estimated by multiplying the average clock period by the ratio of the individual stage edge counts to the average total count for a clock period.

In step 806, the test controller 704 calculates a frequency 710B of the second clock signal produced by the ring oscillator 102B and a delay width 712B of a second carry chain circuit 104B. The test controller 704 may determine the frequency 710B by dividing the number of clock edges counted by counter 702B over a set period of time. To compute the delay width 712B, the number of positive and negative clock edges captured in a given stage of the carry chain circuit 104B may be counted. These counts are proportional to the delay of each stage of the carry chain circuit 104B. The sums of these counts represent the total number of positive or negative edge transitions experienced by a set of the carry chain stages. The average of this total is taken for the first full period in each of the clock captures over the total number of experiments. The delay of each stage is estimated by multiplying the average clock period by the ratio of the individual stage edge counts to the average total count for a clock period.

In step 808, the test controller 704 calculates a jitter 714 of the clock signal from the ring oscillator 102B. The test controller 704 may determine this difference based on the frequency 710A with the frequency 710B and the delay width 712A with the delay width 712B. For example, the standard deviation of the jitter accumulated over a given time period may be calculated using the frequency 710 and the delay width 712. For a given sample, first determine the timing of the most recent falling edge by summing the delays of each stage that has experienced the last falling edge with the average clock period times the recorded ripple count of rising edges for a given amount of jitter accumulation time. Average the differences of this timing for the two circuits (e.g., ring oscillators 102A/B and carry chain circuits 104A/B) across a large number of experiments and compute the standard deviation. The ratio of the variance in the differential delays to the accumulation time represents the jitter 714.

Figure 9:
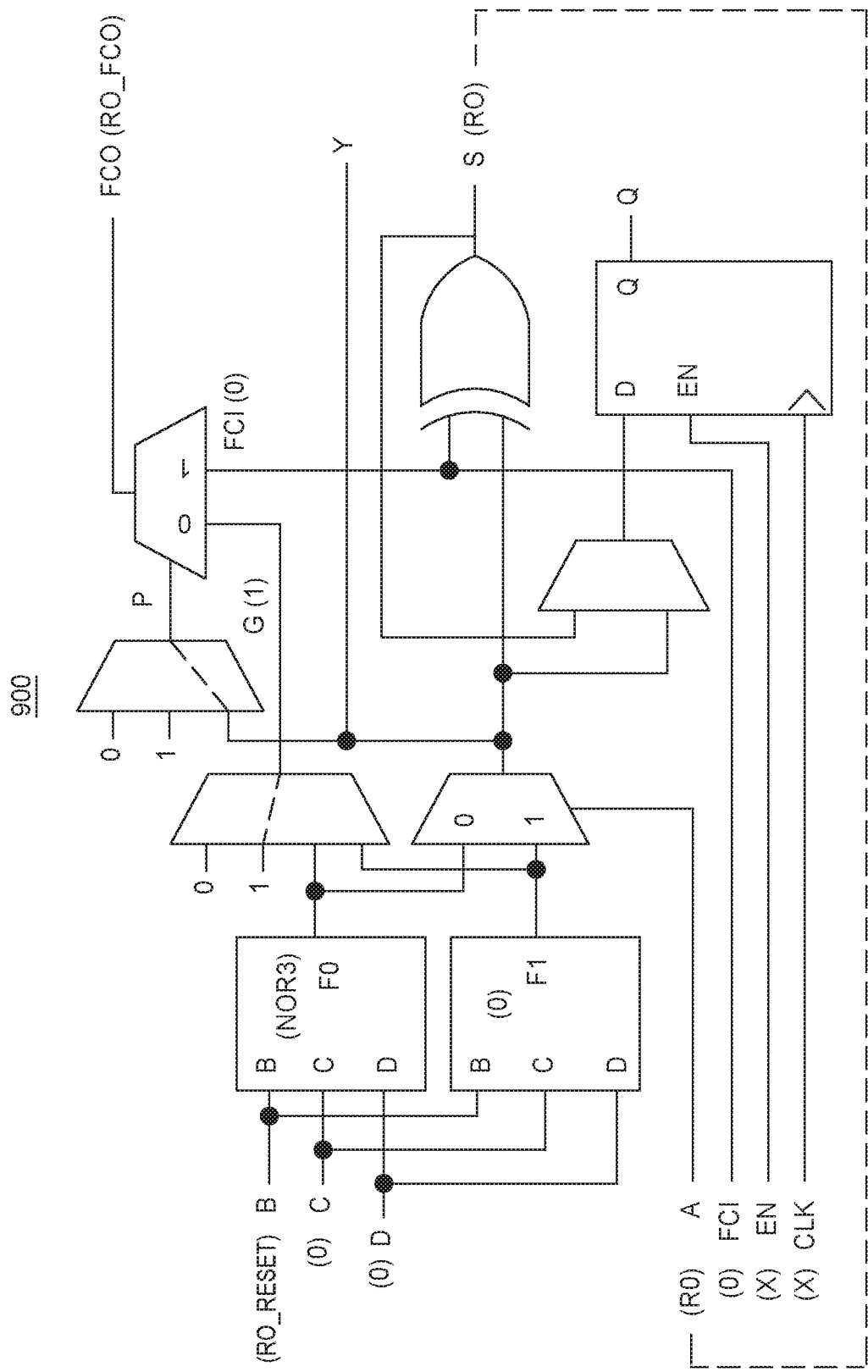
FIG. 9 illustrates an example ring oscillator of the example random number generator of FIG. 1.

FIG. 9 illustrates an example ring oscillator 900 of the example random number generator 100 of FIG. 1. The ring oscillator 900 may be the same as the ring oscillators 102 used in the random number generator 100 and test circuit 700 described herein. As seen in FIG. 9, the ring oscillator 900 includes lookup tables F0 and F1. A feedback loop connects output S with input A.

When RO_RESET is high, F0 outputs zero, so output Y is zero. When RO_RESET is low, the oscillation runs through A to the mux select that chooses the opposite value (an inversion), through the XOR (acts as a buffer), and back to A (FPGA routing). This loop typically runs near 900 MHz. The output Y also switches the select on the mux that outputs FCO, which has one input high and one input low to drive the oscillator output to the FCO output to begin the carry chain. As a result, the output FCO is an alternating clock signal.

Figure 10:
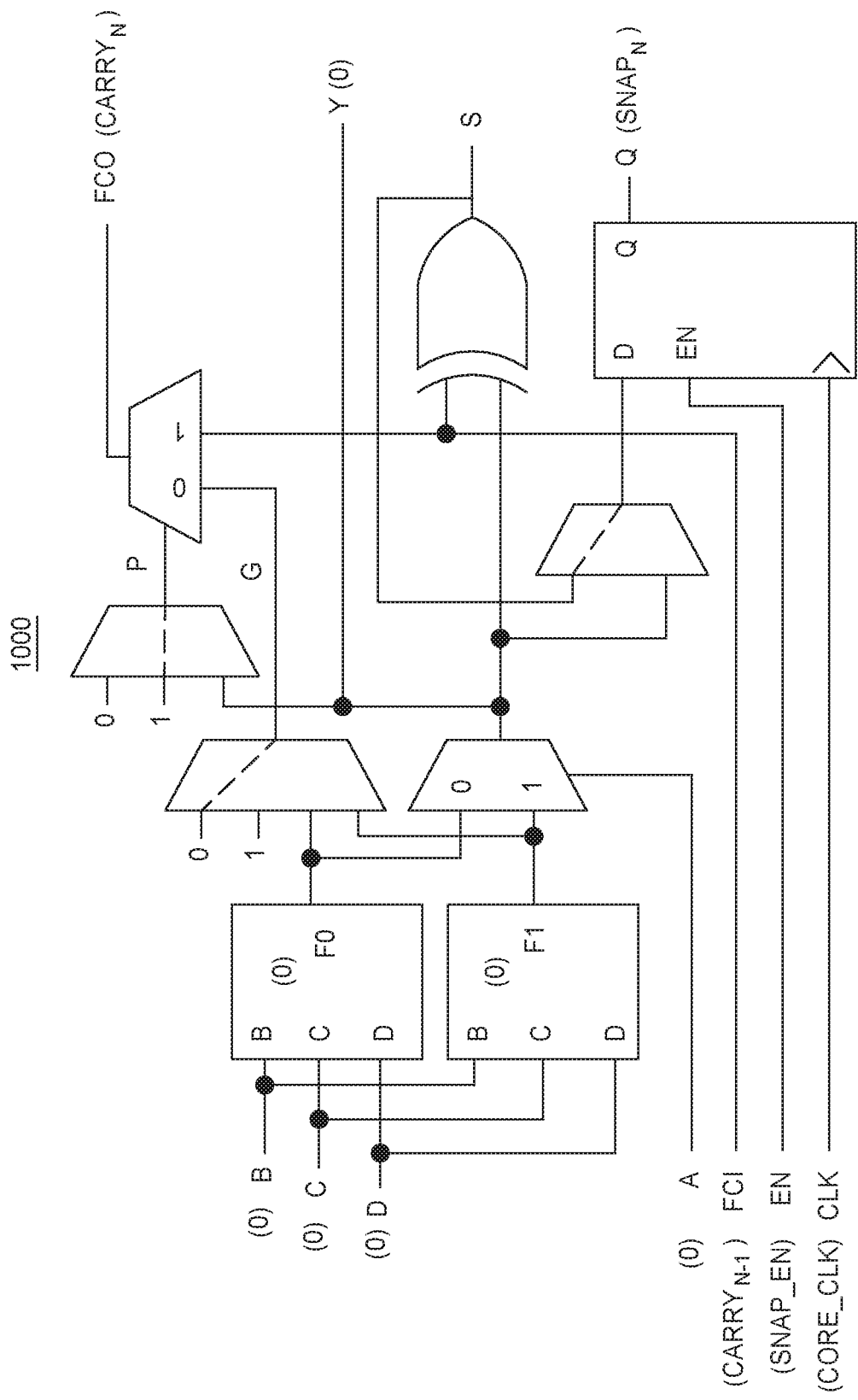
FIG. 10 illustrates an example lookup table element of the example random number generator of FIG. 1.

FIG. 10 illustrates an example lookup table element 1000 of the example random number generator 100 of FIG. 1. The lookup table element 1000 may be the same as the lookup table elements 204 used in the random number generator 100 and test circuit 700 described herein. As seen in FIG. 10, the lookup table element 1000 includes lookup tables F0 and F1. The lookup table element 1000 propagates a signal at input FCI to output FCO. As a result, a clock signal at input FCI will be output at FCO.

The first carry in ($CARRY_{N-1}$) of a carry chain circuit 104 is the clock signal (e.g., RO_FCO from the ring oscillator 900 in FIG. 9) and all subsequent inputs ($CARRY_N$) are the output FCO from the previous lookup table element 1000 in the carry chain circuit 104. Each lookup table element 1000 may have a delay of 13.5 picoseconds (54 picoseconds for four lookup table elements 1000 in sequence). In an example, if there are eighty total lookup table elements 1000 in a carry chain circuit 104, the typical delay of the entire chain is 1080 picoseconds, Capturing the state of the clock signal in each lookup table element may be achieved by enabling (via input SNAP_EN) the $SNAP_N$ register to store the output of the XOR buffer (S) in the CORE_CLK sampling clock domain. The period of the clock signal may be 1111 picoseconds, and the carry chain should be able to record a snapshot of at least that length of time within it so that the detector circuit 106 can find the next edge.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments, Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:

1. An apparatus comprising:
a ring oscillator configured to produce a clock signal;
a carry chain circuit comprising a plurality of stages, each stage of the plurality of stages comprising a plurality of lookup table elements coupled in sequence, the carry chain circuit configured to propagate the clock signal through the plurality of lookup table elements of the plurality of stages; and
a detector circuit configured to:
  determine, based on a value of the clock signal stored by a final lookup table element of each stage of the plurality of stages, which stage of the plurality of stages contains an edge of the clock signal; and
  output a zero if the stage of the plurality of stages that contains the edge is assigned to a first group of the plurality of stages and a one if the stage of the plurality of stages that contains the edge is assigned to a second group of the plurality of stages.

2. The apparatus of claim 1, further comprising:
a second ring oscillator configured to produce a second clock signal; and
a second carry chain circuit comprising a second plurality of stages, each stage of the second plurality of stages comprising a plurality of lookup table elements coupled in sequence, the second carry chain circuit configured to propagate the second clock signal through the plurality of lookup table elements of the second plurality of stages.

3. The apparatus of claim 2, further comprising:
a first counter configured to count a first number of edges of the clock signal over a period of time;
a second counter configured to count a second number of edges of the second clock signal over the period of time;
a controller configured to:
  determine, based on the first number of edges, a frequency of the clock signal and a delay width for the carry chain circuit;
  determine, based on the second number of edges, a frequency of the second clock signal and a delay width for the second carry chain circuit; and determine, based on the frequency of the clock signal, the delay width for the carry chain circuit, the frequency of the second clock signal, and the delay width for the second carry chain circuit, an amount of jitter in the clock signal.

4. The apparatus of claim 3, wherein counting the second number of edges of the second clock signal is based on a value of the second clock signal stored by each lookup table element of the plurality of lookup table elements of a first stage of the second plurality of stages.

5. The apparatus of claim 1, wherein the plurality of stages comprises eight stages and each stage of the plurality of stages comprises twelve lookup table elements.

6. The apparatus of claim 1, wherein the carry chain circuit is configured to capture two periods of the clock signal simultaneously.

7. The apparatus of claim 1, wherein a stage of the plurality of stages assigned to the first group is directly coupled to a stage of the plurality of stages assigned to the second group.

8. A method comprising:
producing, by a ring oscillator, a clock signal;
propagating the clock signal through a plurality of stages of a carry chain circuit, wherein each stage of the plurality of stages comprises a plurality of lookup table elements coupled in sequence;
determining, by a detector circuit and based on a value of the clock signal stored by a final lookup table element of each stage of the plurality of stages, which stage of the plurality of stages contains an edge of the clock signal; and
outputting a zero if the stage of the plurality of stages that contains the edge is assigned to a first group of the plurality of stages and a one if the stage of the plurality of stages that contains the edge is assigned to a second group of the plurality of stages.

9. The method of claim 8, further comprising:
producing, by a second ring oscillator, a second clock signal; and
propagating the second clock signal through a second plurality of stages of a second carry chain circuit, wherein each stage of the second plurality of stages comprises a second plurality of lookup table elements coupled in sequence.

10. The method of claim 9, further comprising:
counting, by a first counter, a first number of edges of the clock signal over a period of time;
counting, by a second counter, a second number of edges of the second clock signal over the period of time;
determining, by a controller and based on the first number of edges, a frequency of the clock signal and a delay width for the carry chain circuit;
determining, by the controller and based on the second number of edges, a frequency of the second clock signal and a delay width for the second carry chain circuit; and
determining, by the controller and based on the frequency of the clock signal, the delay width for the carry chain circuit, the frequency of the second clock signal, and the delay width for the second carry chain circuit, an amount of jitter in the clock signal.

11. The method of claim 10, wherein counting the second number of edges of the second clock signal is based on a value of the second clock signal stored by each lookup table element of the plurality of lookup table elements of a first stage of the second plurality of stages.

12. The method of claim 8, wherein the plurality of stages comprises eight stages and each stage of the plurality of stages comprises twelve lookup table elements.

13. The method of claim 8, further comprising capturing, by the carry chain circuit, two periods of the clock signal simultaneously.

14. The method of claim 8, wherein a stage of the plurality of stages assigned to the first group is directly coupled to a stage of the plurality of stages assigned to the second group.

15. A field programmable gate array configured to implement:
a ring oscillator configured to produce a clock signal;
a carry chain circuit comprising a plurality of stages, each stage of the plurality of stages comprising a plurality of lookup table elements coupled in sequence, the carry chain circuit configured to propagate the clock signal through the plurality of lookup table elements of the plurality of stages; and
a detector circuit configured to:
determine, based on a value of the clock signal stored by a final lookup table element of each stage of the plurality of stages, which stage of the plurality of stages contains an edge of the clock signal; and
output a zero if the stage of the plurality of stages that contains the edge is assigned to a first group of the plurality of stages and a one if the stage of the plurality of stages that contains the edge is assigned to a second group of the plurality of stages.

16. The field programmable gate array of claim 15, further configured to implement:
a second ring oscillator configured to produce a second clock signal; and
a second carry chain circuit comprising a second plurality of stages, each stage of the second plurality of stages comprising a plurality of lookup table elements coupled in sequence, the second carry chain circuit configured to propagate the second clock signal through the plurality of lookup table elements of the second plurality of stages.

17. The field programmable gate array of claim 16, further configured to implement:
a first counter configured to count a first number of edges of the clock signal over a period of time;
a second counter configured to count a second number of edges of the second clock signal over the period of time;
a controller configured to:
determine, based on the first number of edges, a frequency of the clock signal and a delay width for the carry chain circuit;
determine, based on the second number of edges, a frequency of the second clock signal and a delay width for the second carry chain circuit; and
determine, based on the frequency of the clock signal, the delay width for the carry chain circuit, the frequency of the second clock signal, and the delay width for the second carry chain circuit, an amount of jitter in the clock signal.

18. The field programmable gate array of claim 17, wherein counting the second number of edges of the second clock signal is based on a value of the second clock signal stored by each lookup table element of the plurality of lookup table elements of a first stage of the second plurality of stages.

19. The field programmable gate array of claim 15, wherein the plurality of stages comprises eight stages and each stage of the plurality of stages comprises twelve lookup table elements.

20. The field programmable gate array of claim 15, wherein the carry chain circuit is configured to capture two periods of the clock signal simultaneously.

\* \* \* \* \*